United States Patent
Byrd et al.

(10) Patent No.: US 11,262,498 B2
(45) Date of Patent: Mar. 1, 2022

(54) MODULE WITH TRANSMIT OPTICAL SUBASSEMBLY AND RECEIVE OPTICAL SUBASSEMBLY

(71) Applicant: ROCKLEY PHOTONICS LIMITED, Oxford (GB)

(72) Inventors: Gerald Cois Byrd, Shadow Hills, CA (US); Chia-Te Chou, Pasadena, CA (US); Karlheinz Muth, Richardson, TX (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/945,569

(22) Filed: Jul. 31, 2020

(65) Prior Publication Data

US 2020/0363585 A1  Nov. 19, 2020

Related U.S. Application Data

(63) Continuation of application No. 16/051,237, filed on Jul. 31, 2018, now Pat. No. 10,761,262.
(Continued)

(51) Int. Cl.
*G02B 6/12* (2006.01)
*G02B 6/42* (2006.01)
(Continued)

(52) U.S. Cl.
CPC ..... *G02B 6/12004* (2013.01); *G02B 6/12002* (2013.01); *G02B 6/426* (2013.01);
(Continued)

(58) Field of Classification Search
CPC .......... G02B 6/12004; G02B 6/4274; G02B 6/4272; G02B 6/426; G02B 6/4246;
(Continued)

(56) References Cited

U.S. PATENT DOCUMENTS 6,910,812 B2  6/2005  Pommer et al.
6,958,907 B2  10/2005  Sato et al.
(Continued)

FOREIGN PATENT DOCUMENTS

CN  203037898 U  7/2013
CN  103995324 A  8/2014
(Continued)

OTHER PUBLICATIONS

Chinese Notification of the First Office Action, for Patent Application No. 201880028589.2, dated Jun. 2, 2021, 11 pages.
(Continued)

*Primary Examiner* — Andrew Jordan
(74) *Attorney, Agent, or Firm* — Lewis Roca Rothgerber Christie LLP

(57) ABSTRACT

An optoelectronic module. In some embodiments, the module includes: a housing, a substantially planar subcarrier, a photonic integrated circuit, and an analog electronic integrated circuit. The subcarrier has a thermal conductivity greater than 10 W/m/K. The photonic integrated circuit and the analog electronic integrated circuit are secured to a first side of the subcarrier, and the subcarrier is secured to a first wall of the housing. A second side of the subcarrier, opposite the first side of the subcarrier, is parallel to, secured to, and in thermal contact with, an interior side of the first wall of the housing.

20 Claims, 24 Drawing Sheets

Related U.S. Application Data

(60) Provisional application No. 62/539,929, filed on Aug. 1, 2017.

(51) Int. Cl.
  *H01L 25/16* (2006.01)
  *H04B 10/25* (2013.01)
  *H04B 10/40* (2013.01)

(52) U.S. Cl.
  CPC ......... *G02B 6/4246* (2013.01); *G02B 6/4257* (2013.01); *G02B 6/4263* (2013.01); *G02B 6/4266* (2013.01); *G02B 6/4272* (2013.01); *G02B 6/4274* (2013.01); *G02B 6/4281* (2013.01); *H01L 25/167* (2013.01); *H04B 10/25* (2013.01); *H04B 10/40* (2013.01); *G02B 6/4249* (2013.01); *G02B 6/4271* (2013.01)

(58) Field of Classification Search
  CPC .................. G02B 6/4257; G02B 6/12002; G02B 6/4263; G02B 6/4266; G02B 6/4281; G02B 6/4249; G02B 6/4271; H01L 25/167; H04B 10/25; H04B 10/40
  See application file for complete search history.

(56) References Cited

U.S. PATENT DOCUMENTS

| | | |
|---|---|---|
| 7,198,412 B2 | 4/2007 | Hamasaki et al. |
| 7,259,031 B1 | 8/2007 | Dickinson et al. |
| 7,400,239 B2* | 7/2008 | Kiko ............ H01H 9/52 340/501 |
| 7,636,522 B2 | 12/2009 | Nagarajan et al. |
| 7,970,280 B2 | 6/2011 | Morton |
| 8,727,508 B2 | 5/2014 | Nystrom et al. |
| 8,971,676 B1 | 3/2015 | Thacker et al. |
| 9,002,155 B2 | 4/2015 | Li et al. |
| 9,031,412 B2 | 5/2015 | Nagarajan et al. |
| 9,064,861 B2 | 6/2015 | Musk |
| 9,112,616 B2 | 8/2015 | McColloch |
| 9,151,663 B2 | 10/2015 | Yu et al. |
| 9,172,468 B2 | 10/2015 | Kurashima |
| 9,217,835 B2 | 12/2015 | Ishiyama et al. |
| 9,322,938 B2 | 4/2016 | Kämmerer et al. |
| 9,435,959 B2 | 9/2016 | Doerr et al. |
| 9,500,821 B2 | 11/2016 | Hochberg et al. |
| 9,866,929 B2 | 1/2018 | Frankel et al. |
| 9,874,688 B2 | 1/2018 | Doerr et al. |
| 10,026,723 B2 | 7/2018 | Evans et al. |
| 10,037,982 B2 | 7/2018 | Evans et al. |
| 10,097,271 B2 | 10/2018 | Doerr |
| 10,120,132 B2 | 11/2018 | Kojima et al. |
| 10,142,712 B2 | 11/2018 | Garcia et al. |
| 10,151,940 B2 | 12/2018 | Guzzon et al. |
| 10,365,436 B2 | 7/2019 | Byrd et al. |
| 10,509,165 B2 | 12/2019 | Celo et al. |
| 10,761,262 B2* | 9/2020 | Byrd ............... G02B 6/12004 |
| 2002/0176679 A1 | 11/2002 | Nashimoto |
| 2004/0062491 A1 | 4/2004 | Sato et al. |
| 2005/0058408 A1 | 3/2005 | Colgan et al. |
| 2005/0248019 A1 | 11/2005 | Chao et al. |
| 2005/0249509 A1 | 11/2005 | Nagarajan et al. |
| 2006/0065510 A1* | 3/2006 | Kiko .............. H01H 11/0031 200/1 R |
| 2006/0088319 A1 | 4/2006 | Morton |
| 2006/0196651 A1 | 9/2006 | Board et al. |
| 2007/0159636 A1 | 7/2007 | Jayaraman |
| 2008/0023722 A1 | 1/2008 | Lee et al. |
| 2010/0166424 A1 | 7/2010 | Nagarajan et al. |
| 2010/0284698 A1 | 11/2010 | McColloch |
| 2011/0204327 A1 | 8/2011 | Hiruma et al. |
| 2011/0226951 A1 | 9/2011 | Kämmerer et al. |
| 2012/0033208 A1 | 2/2012 | Hara et al. |
| 2013/0049018 A1 | 2/2013 | Ramer et al. |
| 2013/0049040 A1 | 2/2013 | Ramer et al. |
| 2013/0049041 A1 | 2/2013 | Ramer et al. |
| 2013/0120505 A1 | 5/2013 | Nystrom et al. |
| 2013/0193304 A1 | 8/2013 | Yu et al. |
| 2013/0308898 A1 | 11/2013 | Doerr et al. |
| 2014/0010551 A1 | 1/2014 | Kurashima |
| 2014/0064659 A1 | 3/2014 | Doerr et al. |
| 2014/0147085 A1 | 5/2014 | Lim |
| 2014/0233166 A1 | 8/2014 | O'Shea |
| 2015/0076661 A1 | 3/2015 | Musk |
| 2015/0084490 A1 | 3/2015 | Fujiwara |
| 2015/0098675 A1 | 4/2015 | Ishiyama et al. |
| 2015/0221825 A1 | 8/2015 | Ko et al. |
| 2015/0277069 A1 | 10/2015 | Okamoto et al. |
| 2016/0013866 A1 | 1/2016 | Doerr |
| 2016/0056336 A1 | 2/2016 | Hwang et al. |
| 2016/0062039 A1 | 3/2016 | Zhang et al. |
| 2016/0085038 A1 | 3/2016 | Decker et al. |
| 2016/0111407 A1 | 4/2016 | Krasulick |
| 2016/0238371 A1 | 8/2016 | Lloret Soler et al. |
| 2016/0334594 A1 | 11/2016 | Leigh et al. |
| 2016/0341920 A1 | 11/2016 | Stapleton et al. |
| 2017/0003450 A1 | 1/2017 | Rickman et al. |
| 2017/0075149 A1 | 3/2017 | Guzzon et al. |
| 2017/0194308 A1 | 7/2017 | Evans et al. |
| 2017/0194309 A1 | 7/2017 | Evans et al. |
| 2017/0194310 A1 | 7/2017 | Evans et al. |
| 2018/0023779 A1 | 1/2018 | Seif et al. |
| 2018/0098138 A1 | 4/2018 | Frankel et al. |
| 2018/0196196 A1 | 7/2018 | Byrd et al. |
| 2018/0203187 A1 | 7/2018 | Doerr et al. |
| 2018/0284345 A1 | 10/2018 | Kojima et al. |
| 2018/0284373 A1 | 10/2018 | Lin et al. |
| 2019/0041576 A1 | 2/2019 | Byrd et al. |
| 2019/0081453 A1 | 3/2019 | Meehan et al. |
| 2019/0324201 A1 | 10/2019 | Celo et al. |
| 2020/0064547 A1 | 2/2020 | Goodwill et al. |
| 2020/0073050 A1 | 3/2020 | Byrd et al. |
| 2020/0363585 A1* | 11/2020 | Byrd ................ G02B 6/12002 |

FOREIGN PATENT DOCUMENTS

| | | |
|---|---|---|
| CN | 104793300 A | 7/2015 |
| CN | 106371176 A | 2/2017 |
| CN | 106980159 A | 7/2017 |

OTHER PUBLICATIONS

Partial English translation of the Chinese Notification of the First Office Action, for Patent Application No. 201880028589.2, dated Jun. 2, 2021, 4 pages.

"Designing with the AOC 10Gbps TOSA and ROSA", Finisar Application Note AN-2132, Jun. 2, 2015, pp. 1-33, Finisar Corporation, Sunnyvale, California, USA.

International Search Report and Written Opinion of the International Searching Authority, dated Apr. 5, 2018, Corresponding to PCT/EP2018/050188, 15 pages.

International Search Report and Written Opinion of the International Searching Authority, dated Nov. 30, 2018, Corresponding to PCT/IB2018/000980, 18 pages.

U.S. Office Action dated Nov. 1, 2018, for U.S. Appl. No. 15/862,463, 15 pages.

Web page with photograph, https://community.mellanox.com/servlet/rtaImage?eid=ka21T00000054Vu&feoid=00N5000000AYucA&refid=0EM1T000000uNdV, printed to PDF Jan. 17, 2019, 1 page.

European Patent Office Communication pursuant to Article 94(3) EPC, for Patent Application No. 18 766 327.3, dated Nov. 16, 2021, 6 pages.

U.K. Intellectual Property Office Examination Report, dated Sep. 29, 2021, for Patent Application No. GB2002794.2, 2 pages.

Chinese Notification of the Second Office Action, for Patent Application No. 201880028589.2, dated Nov. 29, 2021, 12 pages.

(56) References Cited

OTHER PUBLICATIONS

Partial English translation of the Chinese Notification of the Second Office Action, for Patent Application No. 201880028589.2, dated Nov. 29, 2021, 17 pages.

* cited by examiner

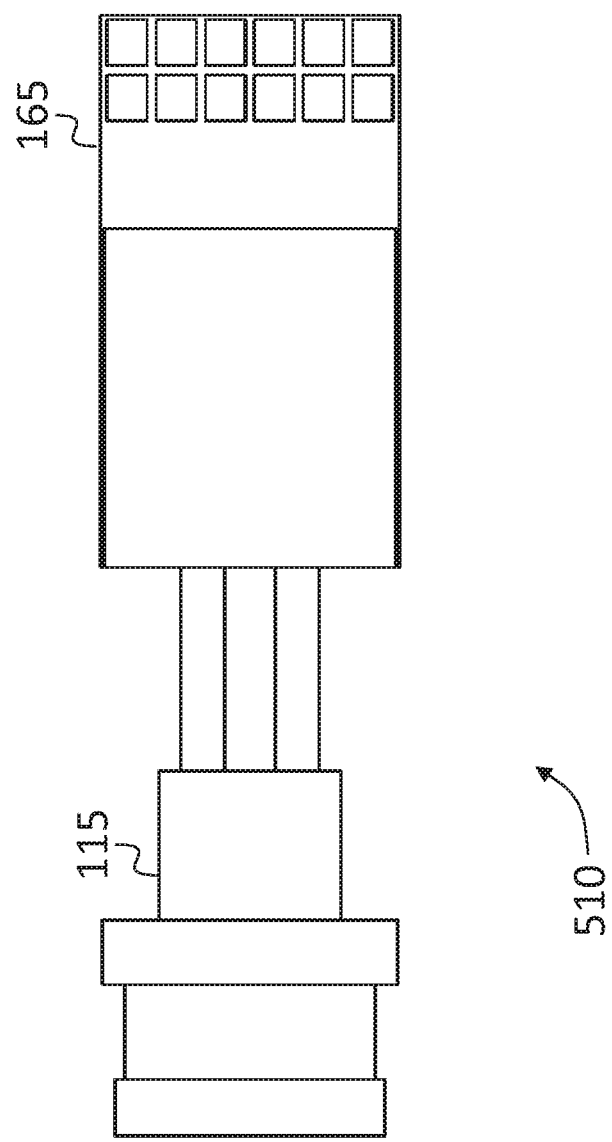

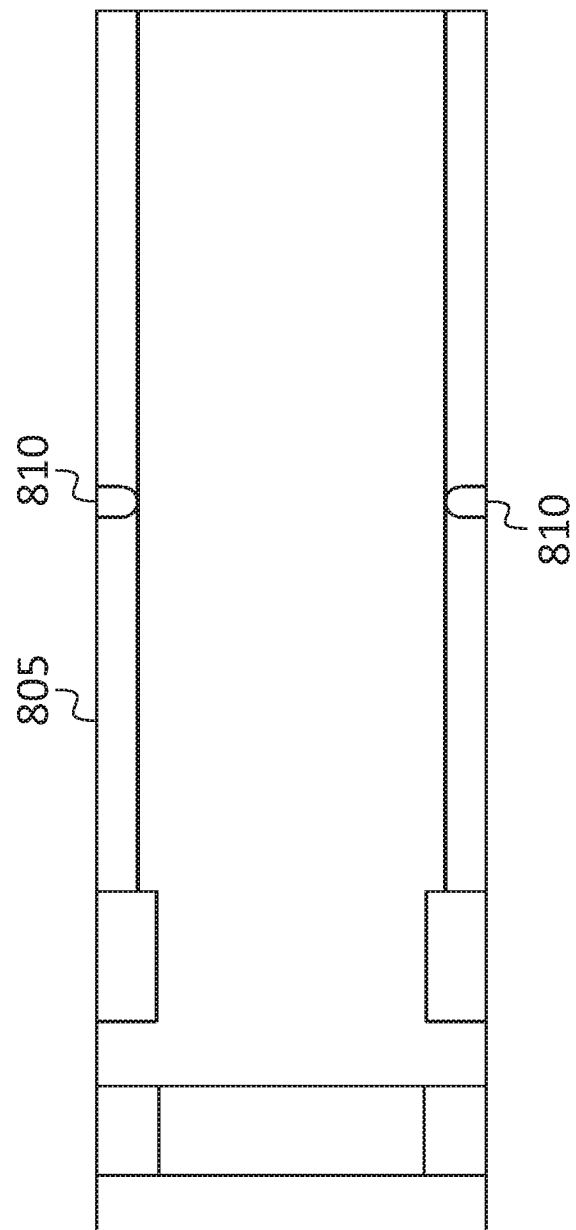

MODULE WITH TRANSMIT OPTICAL SUBASSEMBLY AND RECEIVE OPTICAL SUBASSEMBLY

CROSS-REFERENCE TO RELATED APPLICATION(S)

The present application is a continuation of U.S. patent application Ser. No. 16/051,237, filed Jul. 31, 2018, entitled "MODULE WITH TRANSMIT OPTICAL SUBASSEMBLY AND RECEIVE OPTICAL SUBASSEMBLY", which claims priority to and the benefit of U.S. Provisional Application No. 62/539,929, filed Aug. 1, 2017, entitled "OPTOELECTRONIC PLUGGABLE TRANSCEIVER MODULE WITH TRANSMIT OPTICAL SUBASSEMBLY AND RECEIVE OPTICAL SUBASSEMBLY", the entire contents of both of which are incorporated herein by reference.

FIELD

One or more aspects of embodiments according to the present invention relate to optoelectronic modules.

BACKGROUND

Pluggable transceivers which include (i) one or more transmitters to convert electrical signals carrying data to optical signals carrying the same data and (ii) one or more receivers to convert optical signals to electrical signals may be used, for example, in switching systems. The design of a pluggable module may pose various challenges, including respecting space constraints, and keeping components in the module within acceptable temperature ranges.

SUMMARY

According to an embodiment of the present disclosure there is provided a transceiver assembly, including: a housing; and an optical subassembly, the optical subassembly including: a fiber, a photonic integrated circuit, an analog electronic integrated circuit, and a substantially planar subcarrier; the subcarrier having a thermal conductivity greater than 10 W/m/K; the photonic integrated circuit and the analog electronic integrated circuit being on the subcarrier; the fiber being coupled to the photonic integrated circuit; the subcarrier being parallel to, secured to, and in thermal contact with, a first wall of the housing; the photonic integrated circuit being connected to the analog electronic integrated circuit; and the optical subassembly having a plurality of contact pads for establishing electrical connections between the analog electronic integrated circuit and test equipment probes, the optical subassembly being configured to be separately testable by supplying power to the optical subassembly through one or more of the contact pads and sending data to and and/or receiving data from the optical subassembly through one or more of the contact pads.

In one embodiment, the analog electronic integrated circuit is adjacent to the photonic integrated circuit and connected to the photonic integrated circuit by a first plurality of wire bonds. In one embodiment, the wire bonds extend from wire bond pads along an edge of the analog electronic integrated circuit to wire bond pads along an edge, of the photonic integrated circuit, nearest the analog electronic integrated circuit.

In one embodiment, the optical subassembly further includes a flexible printed circuit, connected to the analog electronic integrated circuit.

In one embodiment, the optical subassembly further includes a routing board, and the analog electronic integrated circuit is connected to the flexible printed circuit through the routing board.

In one embodiment, the routing board is a printed circuit including an organic insulating material and conductive traces, the routing board is connected to the analog electronic integrated circuit, along an edge of the analog electronic integrated circuit, by wire bonds.

In one embodiment, the flexible printed circuit is further connected to the host board.

According to an embodiment of the present disclosure there is provided a module, including: a housing; a substantially planar subcarrier; a photonic integrated circuit; and an analog electronic integrated circuit, the subcarrier having a thermal conductivity greater than 10 W/m/K, the photonic integrated circuit and the analog electronic integrated circuit being secured to a first side of the subcarrier, the subcarrier being secured to a first wall of the housing, wherein a second side of the subcarrier, opposite the first side of the subcarrier, is parallel to, secured to, and in thermal contact with, an interior side of the first wall of the housing.

In one embodiment, the photonic integrated circuit is adjacent to the analog electronic integrated circuit.

In one embodiment, the photonic integrated circuit is connected to the analog electronic integrated circuit by wire bonds.

In one embodiment, the wire bonds extend from wire bond pads along an edge of the analog electronic integrated circuit to wire bond pads along an edge, of the photonic integrated circuit, nearest the analog electronic integrated circuit.

In one embodiment, the module further includes an optical subassembly including: the subcarrier; the photonic integrated circuit; and the analog electronic integrated circuit, the optical subassembly having a plurality of contact pads for establishing electrical connections between the analog electronic integrated circuit and test equipment probes, the optical subassembly being configured to be separately testable by supplying power to the optical subassembly through one or more of the contact pads and sending data to and and/or receiving data from the optical subassembly through one or more of the contact pads.

In one embodiment, the optical subassembly further includes a flexible printed circuit, connected to the analog electronic integrated circuit In one embodiment, the optical subassembly further includes a routing board connected to the analog electronic integrated circuit, along an edge of the analog electronic integrated circuit, by wire bonds; the analog electronic integrated circuit is connected to the flexible printed circuit through the routing board; and the routing board is a printed circuit including an organic insulating material and conductive traces.

In one embodiment, the flexible printed circuit is connected to the routing board by solder.

In one embodiment, the module further includes a host board including a microcontroller and/or a DC-DC converter, the host board being connected to the routing board through the flexible printed circuit.

According to an embodiment of the present disclosure there is provided method for manufacturing a module, the method including: assembling an optical subassembly including: a fiber, a photonic integrated circuit, an analog electronic integrated circuit, and a substantially planar subcarrier, the photonic integrated circuit and the analog electronic integrated circuit being on the subcarrier; testing the optical subassembly; determining that the testing of the optical subassembly was successful; and in response to determining that the testing of the testing the optical subassembly was successful, installing the optical subassembly in a housing, with the subcarrier being parallel to, secured to, and in thermal contact with, a first wall of the housing.

In one embodiment, the optical subassembly has a plurality of contact pads for establishing electrical connections between the analog electronic integrated circuit and test equipment probes; and the testing of the optical subassembly includes: transmitting modulated light into the photonic integrated circuit through the fiber, and verifying the presence, at the contact pads, of electrical signals corresponding to the modulation; or the testing of the optical subassembly includes: applying electrical signals to the contact pads, and verifying the presence, in light transmitted through the fiber from the photonic integrated circuit, of modulation corresponding to the electrical signals.

In one embodiment, the method further includes: in response to determining that the testing of the testing the optical subassembly was successful, connecting a host board including a microcontroller and/or a DC-DC converter to the optical subassembly.

In one embodiment, the connecting of the host board to the optical subassembly includes soldering the host board to the optical subassembly.

BRIEF DESCRIPTION OF THE DRAWINGS

These and other features and advantages of the present disclosure will be appreciated and understood with reference to the specification, claims, and appended drawings wherein:

FIG. 7B is a view of testable optical subassembly, according to an embodiment of the present disclosure;

FIG. 8A is a top view of a housing, according to an embodiment of the present disclosure;

DETAILED DESCRIPTION

The detailed description set forth below in connection with the appended drawings is intended as a description of exemplary embodiments of a module with transmit optical subassembly and receive optical subassembly provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
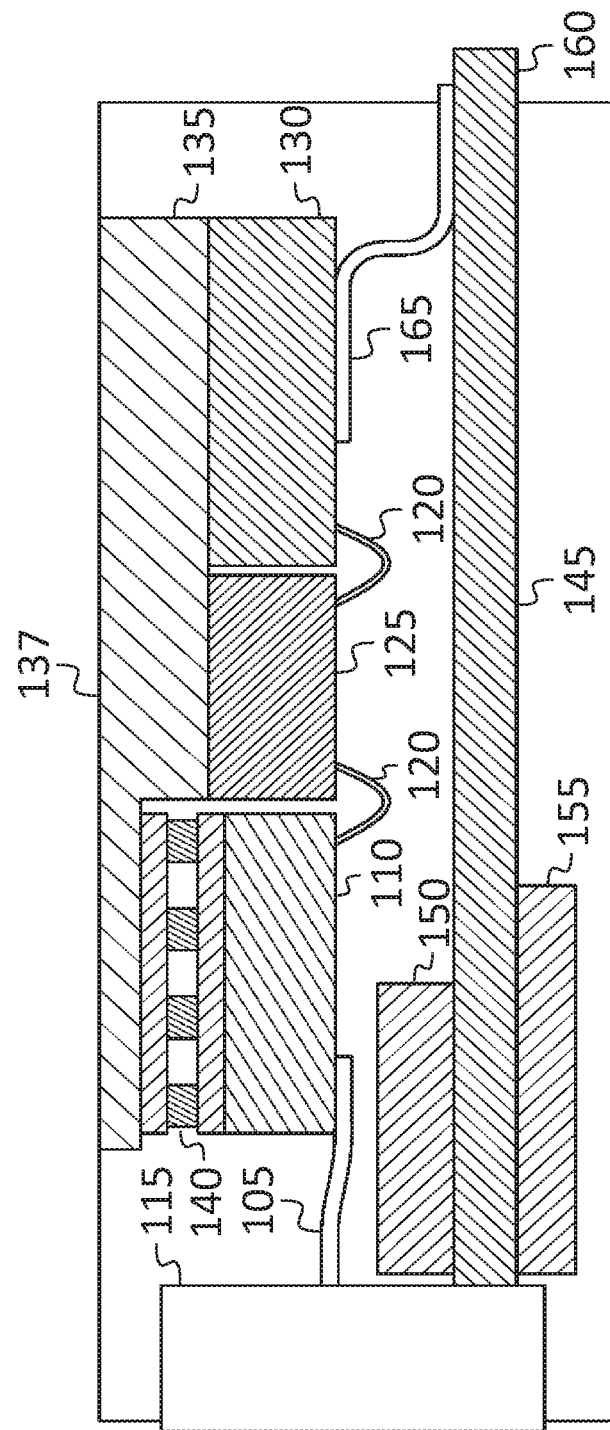
FIG. 1A is a schematic cross-sectional view of an optoelectronic module, according to an embodiment of the present disclosure.
Figure 1B:
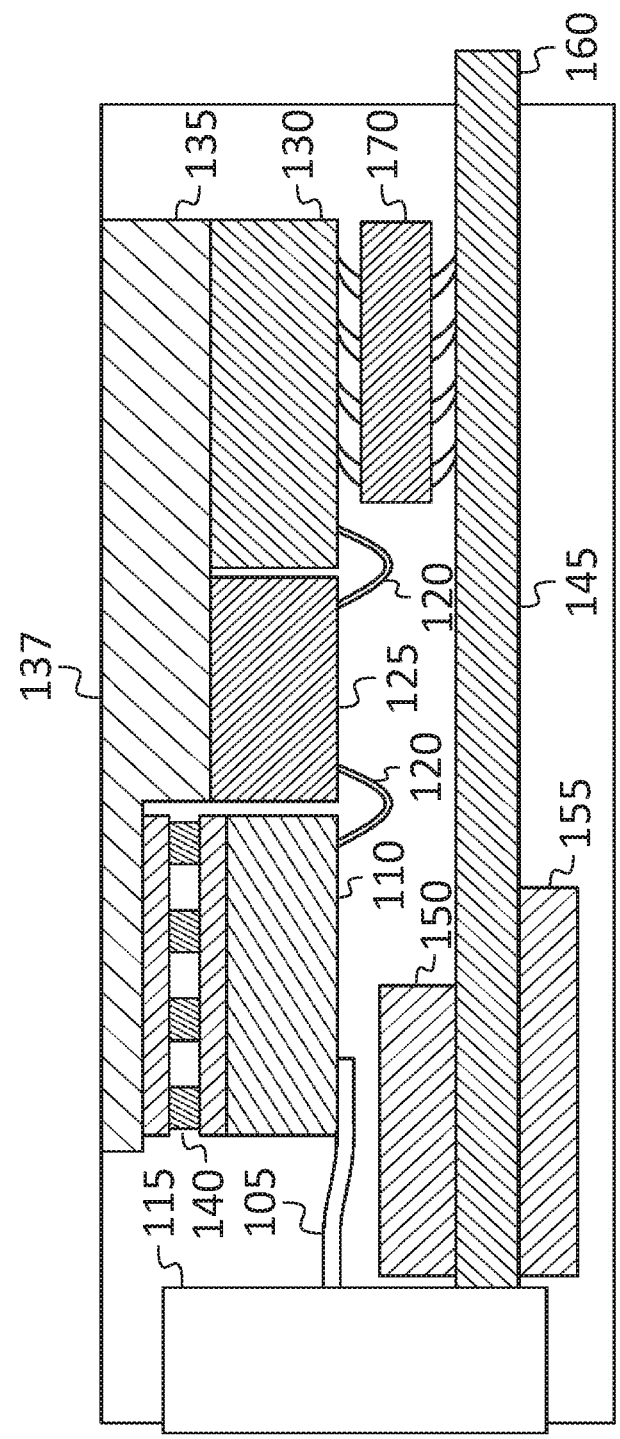
FIG. 1B is a schematic cross-sectional view of an optoelectronic module, according to an embodiment of the present disclosure.

FIGS. 1A-1D show schematic cross-sectional views of several embodiments each including a transceiver in a quad small form-factor pluggable (QSFP) package. Referring to FIGS. 1A and 1B, in some embodiments an optical fiber 105 connects a photonic integrated circuit (PIC) 110 to a Multi-fiber Push On (MPO) connector 115. The PIC 110 is connected by one or more wire bonds 120 to an analog electronic integrated circuit, e.g., an analog application specific integrated circuit (aASIC) 125, which is connected by one or more wire bonds 120 to a routing board 130, which may be a printed circuit board on an organic substrate (e.g., a polymer or fiberglass-reinforced polymer substrate). The PIC 110 may be one of a plurality of PICs 110 (e.g., the module may include both a transmitter PIC and a receiver PIC), and the aASIC 125 may be one of a plurality of aASICs 125 (there being, for example, one aASIC 125 for each PIC 110). The aASIC 125 and the PIC may be bare die. For example, the aASIC 125 may be a bare silicon die, and the PIC 110 may be a bare silicon die (which, in the case of a transmitter PIC, may include a bare laser die (e.g., a bare die of another semiconductor, different from silicon) mounted on a bare silicon die (as discussed in further detail below)). The routing board 130 may be fabricated using a process capable of forming fine pitch features, e.g., traces and wire bond pads on a pitch of 100 microns. The PIC 110, aASIC 125, and routing board 130 may be secured to (e.g., bonded to), and supported by, a subcarrier 135, which may be a block, or a block with a stepped thickness as shown, formed of a thermally conductive material (e.g., a material having a thermal conductivity exceeding 10 W/m/K), e.g., copper. The subcarrier may be substantially planar, i.e., it may have the shape of a sheet having different thicknesses in different regions of the sheet, e.g., having a greater thickness in the region to which the aASIC 125 is secured than in the region to which the PIC 110 and a TEC 140 (discussed in further detail below) are secured. That is, in one or more embodiments, the subcarrier 135 may be a single, monolithic, substantially planar subcarrier. In a system using a QSFP package, thermal control of the top package wall 137 may be provided (e.g., the system may be designed—e.g., with a heat sink—to ensure that the temperature of the top package wall not exceed a specified value). As such, in the embodiments of FIGS. 1A and 1B, heat may be conducted out of the package through the subcarrier 135 and through the top package wall 137.

The PIC 110 may be secured to a thermoelectric cooler (TEC) 140 which may be secured to the subcarrier 135, as shown. In some embodiments, a host board 145, which may be an organic printed circuit board, has installed on it a microcontroller 150 and a DC-DC converter 155, and it has a card-edge connector 160 at the electrical end of the QSFP package. The routing board may be connected to the host board by a flexible circuit or "flex circuit" 165 (FIG. 1A) or by a low profile connector array 170 (or "socket") (e.g., a Z-RAY™ ultra-low profile array available from Samtec (samtec.com)) (FIG. 1B). Because the conductors may spread out on the routing board 130 and/or on the flex circuit 165, the host board is, in some embodiments, fabricated using a lower-cost process not capable of forming fine pitch features. A similar configuration may be used regardless of whether the PIC 110 and the aASIC 125 form a transmitter (transmitting light through the fiber) or a receiver (receiving light through the fiber). In the case of a transmitter, the PIC may include a modulator, and a laser (e.g., a separate laser chip) may be mounted on the PIC, and optically coupled to it, and the aASIC may include a drive circuit for the modulator. In the case of a receiver, the PIC may include a photodetector, and the aASIC may include a transimpedance amplifier to amplify the signal from the photodetector. Each PIC 110 may include an array of modulators or photodetectors, and each aASIC 125 may include a corresponding array of drive circuits or transimpedance amplifiers.

Each PIC 110 may include a waveguide having transverse dimensions of approximately 10 microns at a point at which light couples into the waveguide from the fiber 105, or from the fiber 105 into the waveguide. A mode adapter, e.g., a taper, may guide the light and transform the optical mode to one that propagates in a waveguide having transverse dimensions of approximately 3 microns. The 3 micron waveguide may be used to guide the light to a photodetector, or from a modulator. Further mode adapters (e.g., at a modulator) may be used to effect further changes in the size or shape of the optical mode, e.g., to enable light to propagate through a modulator fabricated on a waveguide with smaller transverse dimension (for improved modulator performance). In some embodiments similar to that of FIG. 1A, the routing board 130 is omitted and the aASIC 125 is connected directly to the flex circuit 165, which is bonded directly to the subcarrier 135. In such an embodiment, longer wire bonds may be used to accommodate the difference in height between the surface of the aASIC 125 and the surface of the flex circuit (which may be significantly thinner than the aASIC 125), or the difference in height may be reduced by thinning the aASIC die, or by using a subcarrier 135 with a stepped thickness (i.e., a subcarrier 135 having a greater thickness under the flex circuit 165 than under the aASIC 125). The flex circuit 165 may be a printed circuit composed of one or more layers of conductive traces and one or more flexible insulating layers. The flexible insulating layers may be composed of a film of plastic (e.g., a film of polyimide) capable of withstanding soldering temperatures, and the flex circuit 165 may be connected to the routing board 130 and to the host board 145 by soldering.

In some embodiments the TEC 140 is absent and the PIC 110 is bonded directly to the subcarrier, or is bonded to an insulating layer bonded to the subcarrier. In some embodiments, a heater is secured to or integrated into the PIC 110 and the temperature of the PIC 110 is actively controlled, based on a signal from a temperature sensor on or integrated into the PIC 110. In such an embodiment, the insulating layer may enable the heater to raise the temperature of the PIC 110 without consuming an excessive amount of power.

Figure 1C:
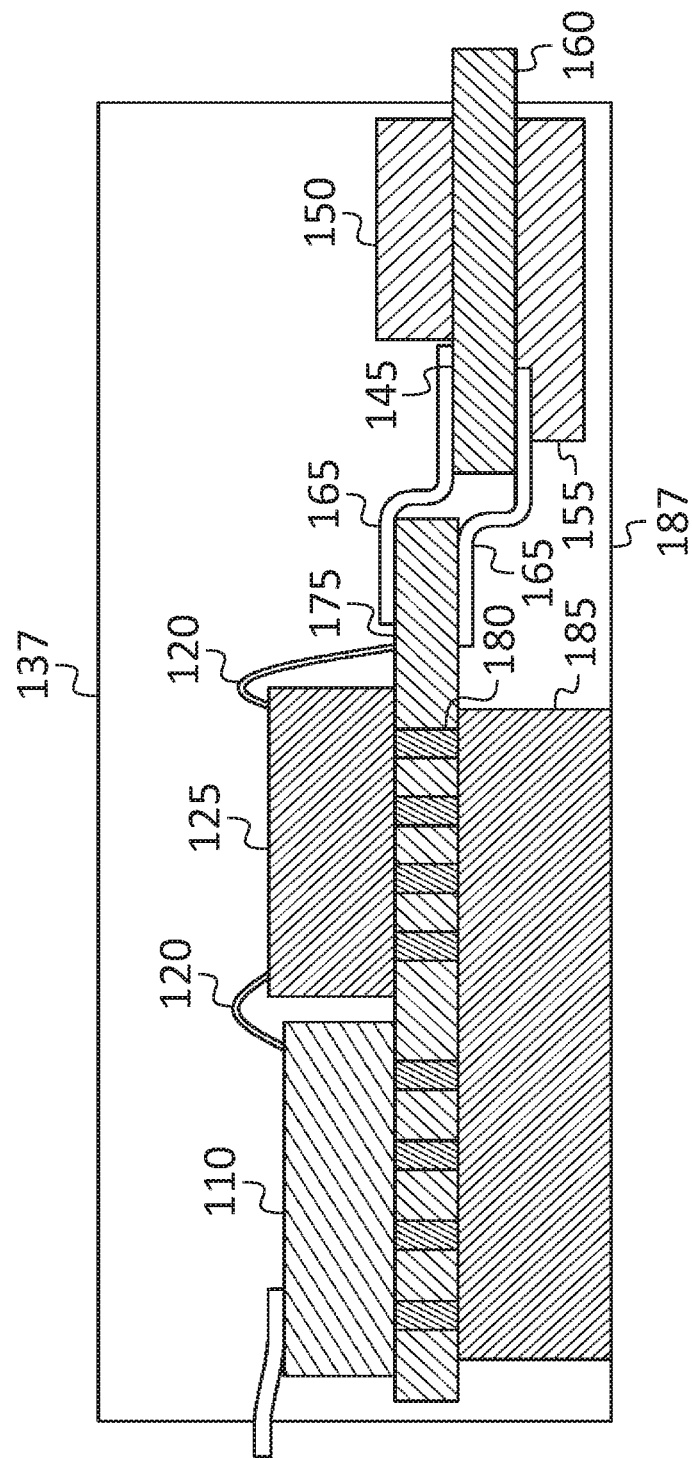
FIG. 1C is a schematic cross-sectional view of an optoelectronic module, according to an embodiment of the present disclosure.
Figure 1D:
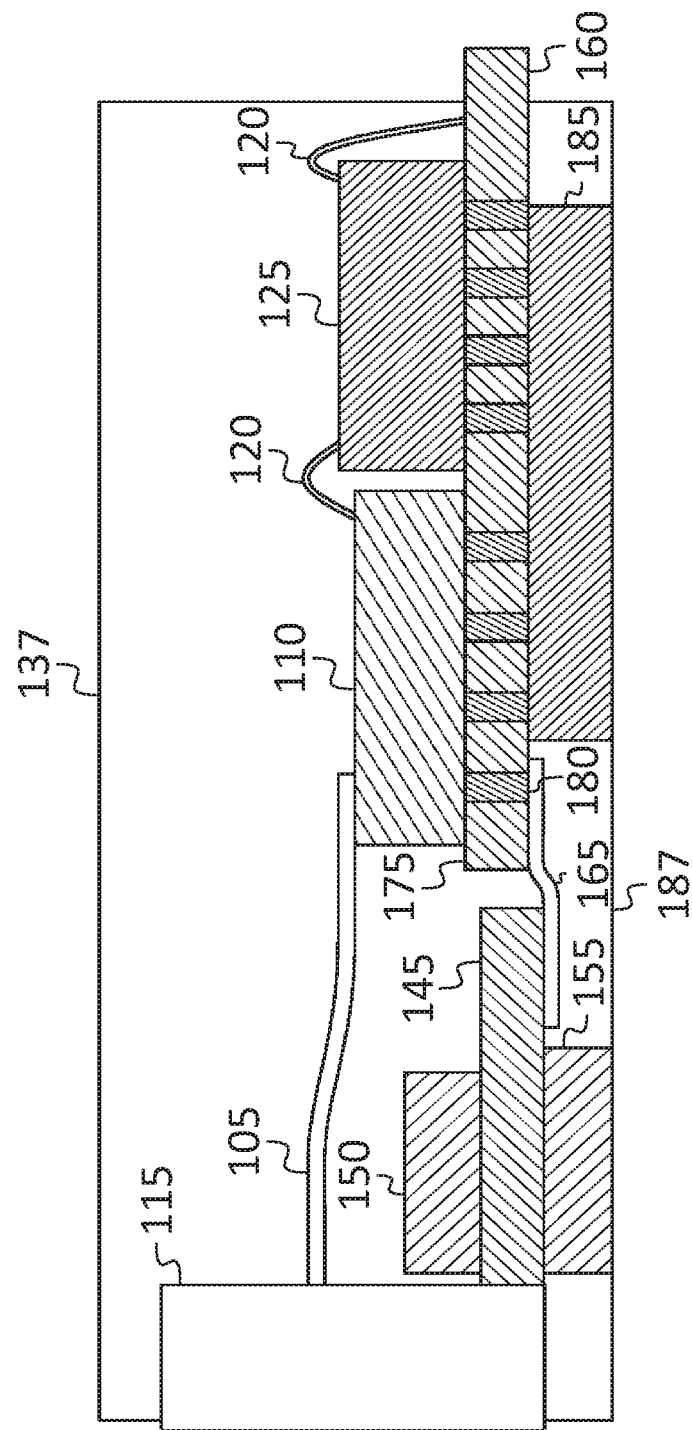
FIG. 1D is a schematic cross-sectional view of an optoelectronic module, according to an embodiment of the present disclosure.

FIG. 1C shows an embodiment in which the MPO connector 115 is absent and the fiber 105 extends directly from the PIC 110 to the exterior of the package. Such a configuration may be referred to as an active optical cable (AOC) configuration. FIG. 1D shows a related embodiment in which the PIC 110 is more distant from the front end (or "optical end") of the package, facilitating the inclusion of an MPO connector 115. In FIGS. 1C and 1D, the PIC 110 and the aASIC 125 may be bonded to a substrate 175, which may be a printed circuit board including one or more layers containing conductive traces and one or more organic insulating layers (e.g., polymer or fiberglass-reinforced polymer insulating layers), with thermal vias 180 for forming a thermal path between (i) the PIC 110 and the aASIC 125 and (ii) a thermal block 185 which supports the substrate 175 and provides a thermal path between the substrate and the bottom wall (or "lower wall") 187 of the package enclosure. In some systems using QSFP packages the lower wall 187 of the package is not directly connected to the heat sink; accordingly, in the embodiments of FIGS. 1C and 1D the side walls of the package may be used to conduct heat to the top package wall. Wire bonds 120 may be used to connect the PIC 110 to the aASIC 125 and to connect the aASIC 125 to the substrate 175. The substrate 175 may be fabricated using a process capable of forming fine pitch features, e.g., traces and wire bond pads on a pitch of 100 microns.

A dual flex circuit (i.e., two parallel flex circuits 165), is used in the embodiment of FIG. 1C to connect the substrate 175 to a host board 145 which has a card-edge connector 160 at the electrical end of the QSFP package, and which has installed on it a microcontroller 150 and a DC-DC converter 155. In the embodiment of FIG. 1D the card-edge connector 160 is at the electrical end of the QSFP package is on the substrate 175, and a separate host board 145 has installed on it a microcontroller 150 and a DC-DC converter 155 and is connected to the substrate 175 by a flex circuit 165.

Figure 2:
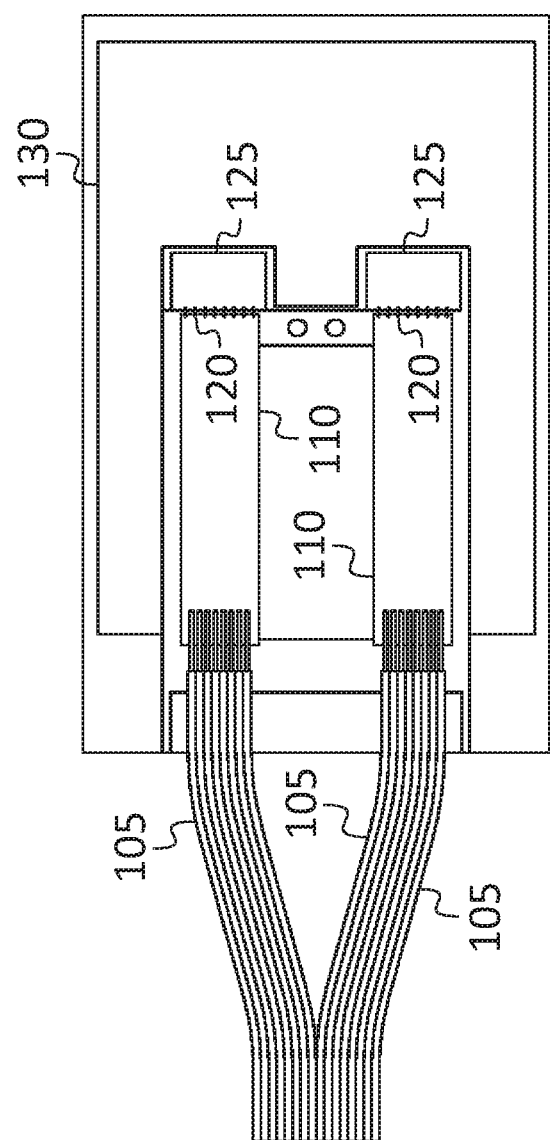
FIG. 2 is a bottom view of a portion of an optoelectronic module, according to an embodiment of the present disclosure.
Figure 3:
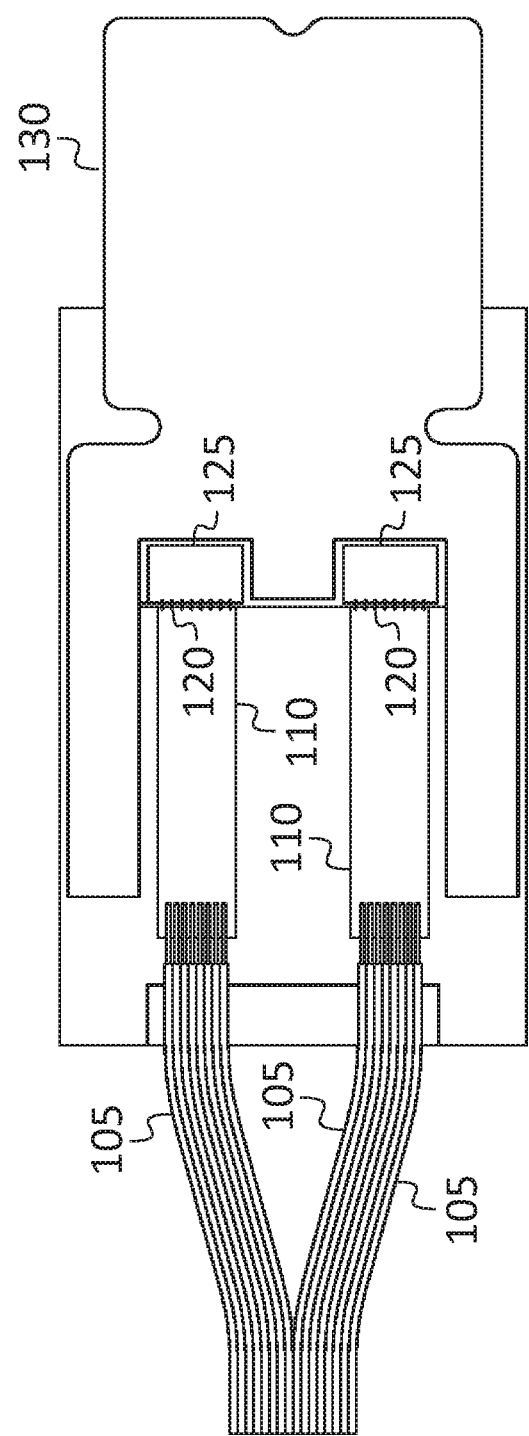
FIG. 3 is a bottom view of a portion of an optoelectronic module, according to an embodiment of the present disclosure.

FIG. 2 shows a bottom view of the embodiment of FIGS. 1A and 1B, in one embodiment, and FIG. 3 shows a bottom view of the embodiment of FIGS. 1A and 1B, in another embodiment. The routing board extends around the aASICs 125 and the PICs 110 so that wire bonds (not shown), for delivering power or control signals to these components (or for providing laser drive current to the laser on the transmitter PIC) may be formed along the side edges of these components. The host board 145 and flex circuit 165 are not shown in FIGS. 2 and 3. Wire bonds for data connections (shown in FIGS. 1A and 1B, and, for the data connections between the aASICs and the PICs, in FIGS. 2 and 3) may be present along the end edges of the aASICs and the PICs.

Figure 4:
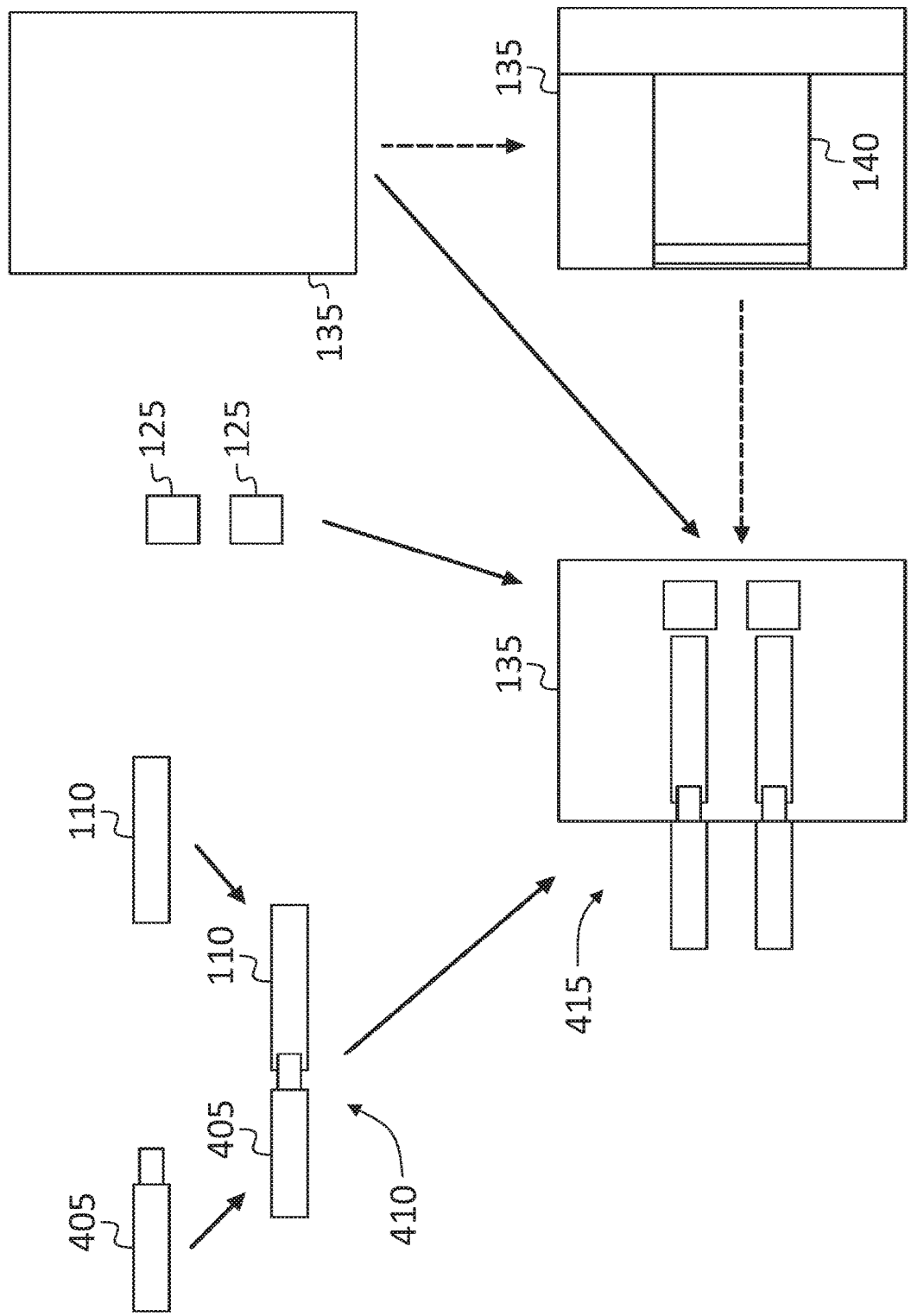
FIG. 4 is an assembly sequence diagram, according to an embodiment of the present disclosure.
Figure 5:
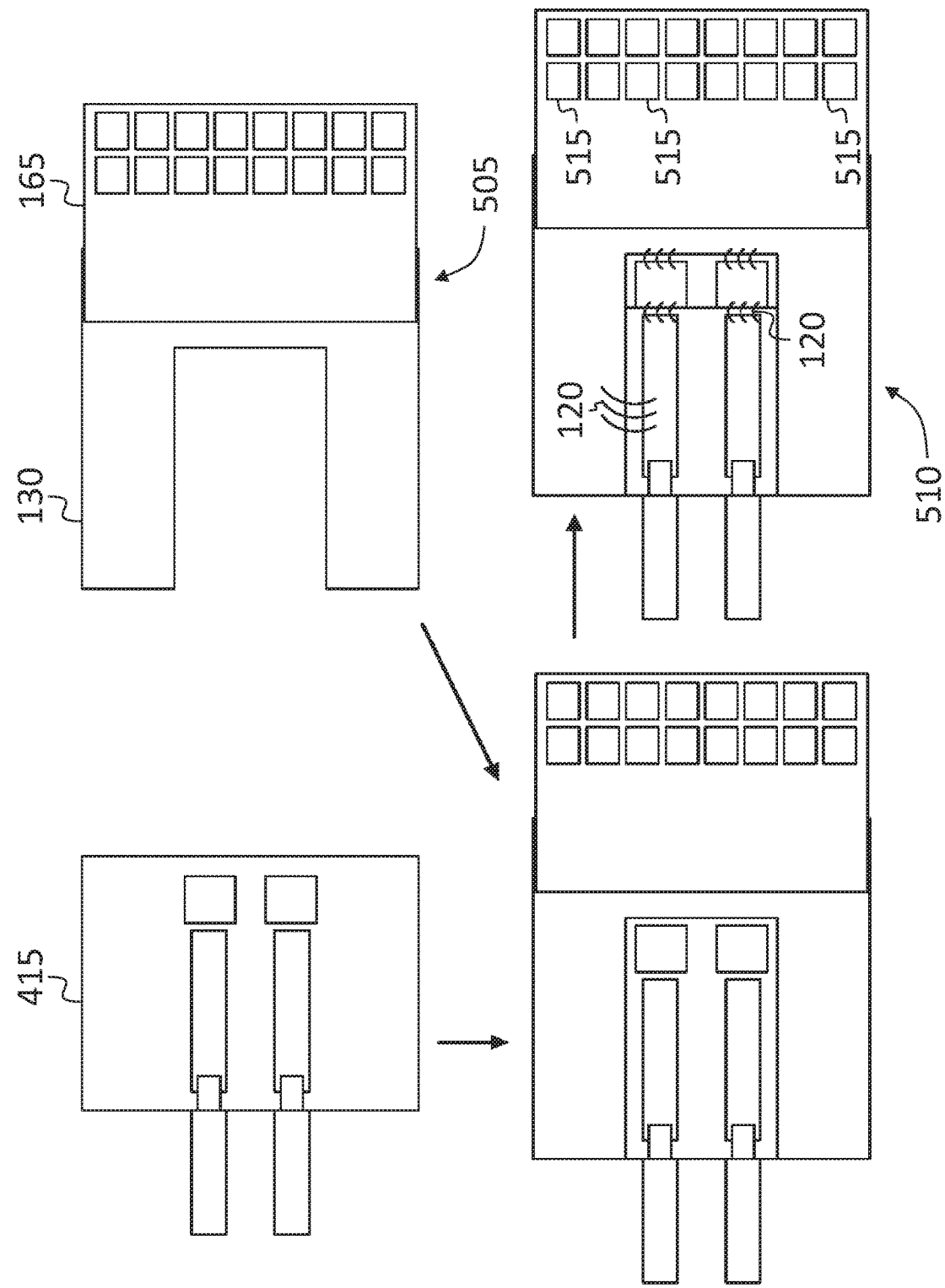
FIG. 5 is an assembly sequence diagram, according to an embodiment of the present disclosure.

FIGS. 4-9 show an assembly sequence for the embodiment of FIGS. 1A and 1B. Referring to FIG. 4, each fiber 105 (of the fibers of a fiber ribbon 405, the other end of which is terminated in an MPO connector 115 (FIG. 7B; not shown in FIGS. 4-6) is aligned in a respective V-groove (e.g., of an array of V-grooves) on the PIC 110 and secured in place to form a "PICtail" 410. The PICtails 410 are secured to the subcarrier (or "carrier") 135 along with the aASICs 125, either directly, to form a first subassembly 415, or (in the alternate sequence shown by dashed arrows) the PICs 110 may be bonded to a TEC 140 which may be bonded to the subcarrier 135. Referring to FIG. 5, a rigid-flex circuit 505 (the combination of the routing board 130 and the flex-circuit 165, which may be separately assembled) is then bonded to the first subassembly 415 of FIG. 4 to form a testable transmit-receive optical subassembly (TROSA) 510 (including the fiber-coupled PICs 110 and the aASICs 125), with pads 515 suitable for making contact with test equipment probes, that may provide power to the TROSA and send or receive data through it. The testable TROSA 510 thus makes it possible to identify and discard a defective optical subassembly without discarding with it, e.g., a host board having installed on it a microcontroller and a DC-DC converter.

Figure 6:
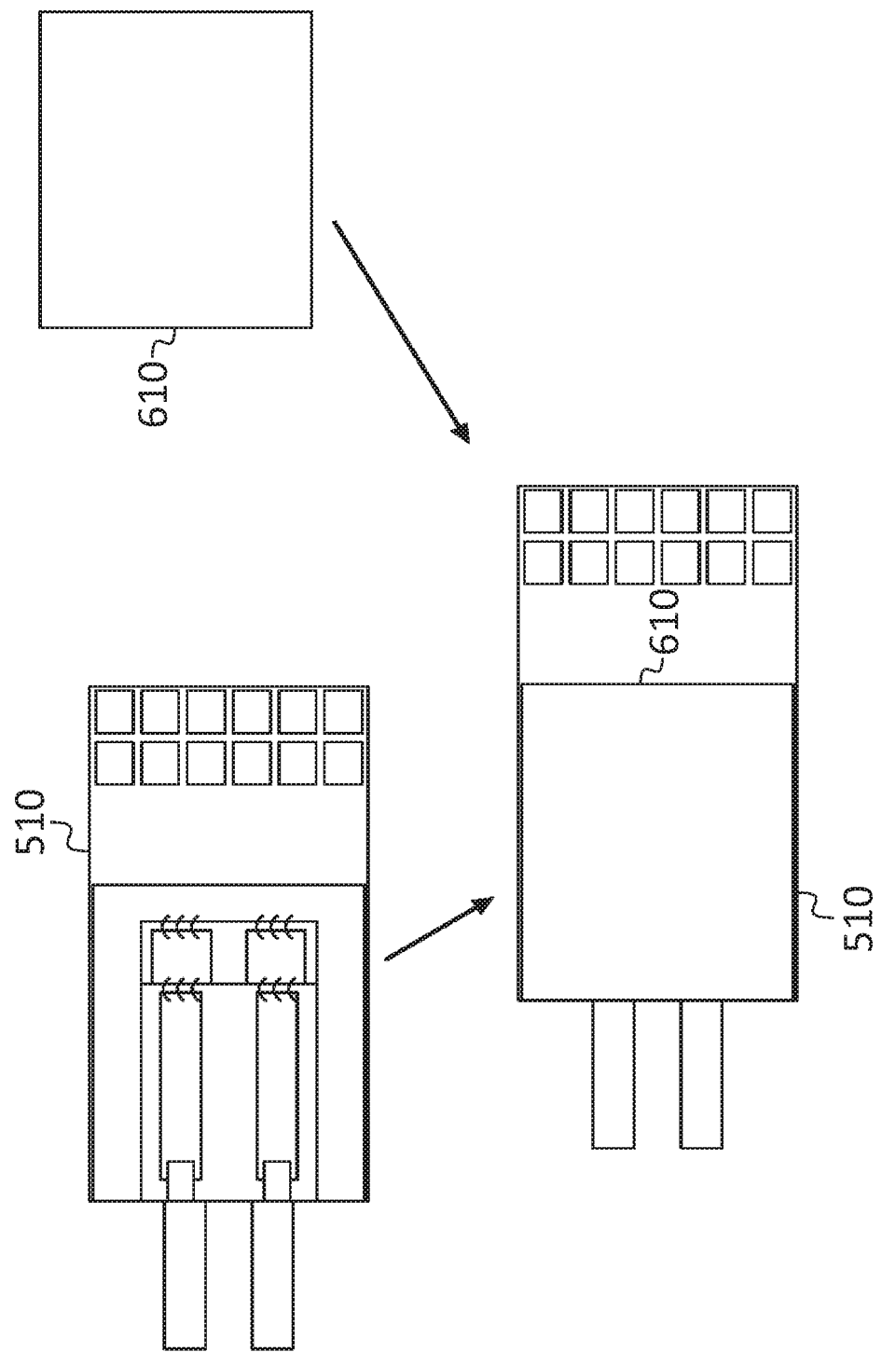
FIG. 6 is an assembly sequence diagram, according to an embodiment of the present disclosure.

Referring to FIG. 6, a cover 610 may then be secured to the TROSA (e.g., to protect it during further handling before the package is assembled). The TROSA 510 may be tested (by supplying modulated light to the receivers and verifying that suitable corresponding electrical signals are produced at the pads 515, and by supplying electrical signals to the pads 515, and verifying that suitably modulated light is produced by the transmitters) either before or after installation of the cover 610. If the test is successful, assembly of the module may proceed; if it is unsuccessful, the TROSA 510 may be discarded or reworked.

Figure 7A:
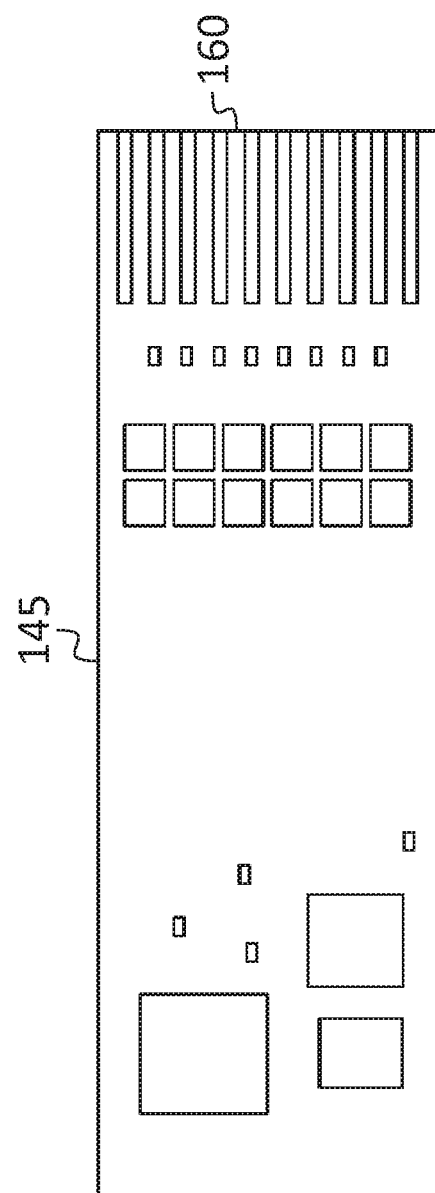
FIG. 7A is a view of a host board, according to an embodiment of the present disclosure.
Figure 7C:
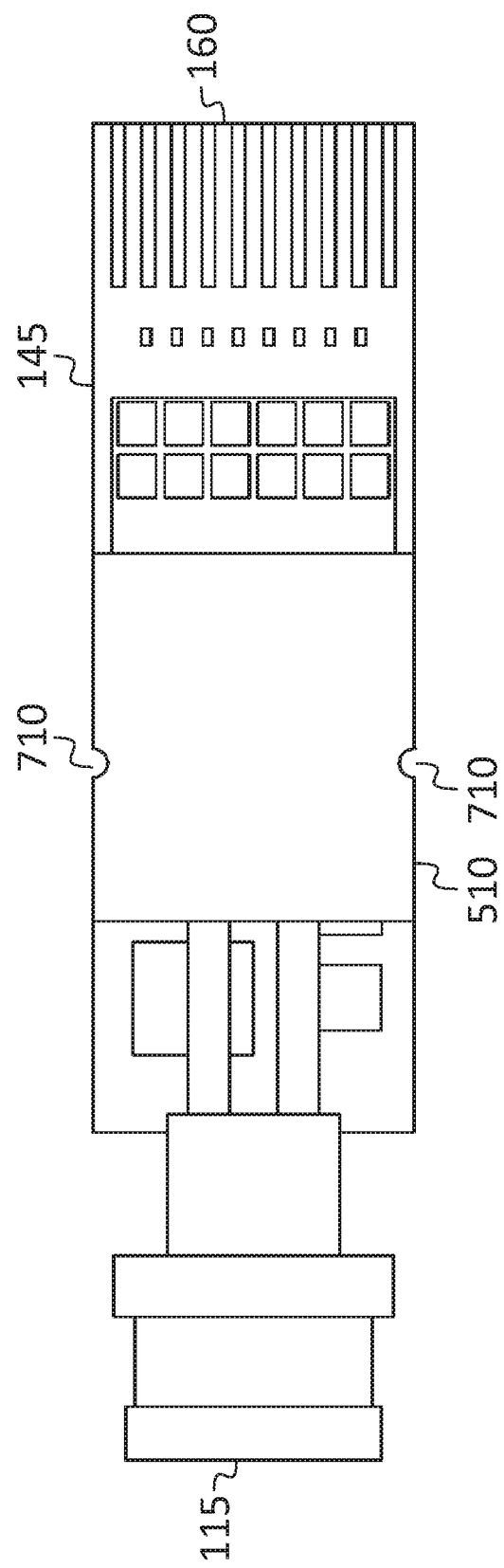
FIG. 7C is a view of a portion of an optoelectronic module, according to an embodiment of the present disclosure.

Referring to FIGS. 7A-7C, the flex circuit of the TROSA 510 is then soldered to the host board 145. FIG. 7C shows the TROSA 510 soldered to the host board 145, with the subcarrier 135 facing up and the cover 610 facing the host board 145. Semicircular cutouts 710 (not shown in the preceding drawings) may be used to register the TROSA 510 and the host board 145 to the module housing.

Figure 8B:
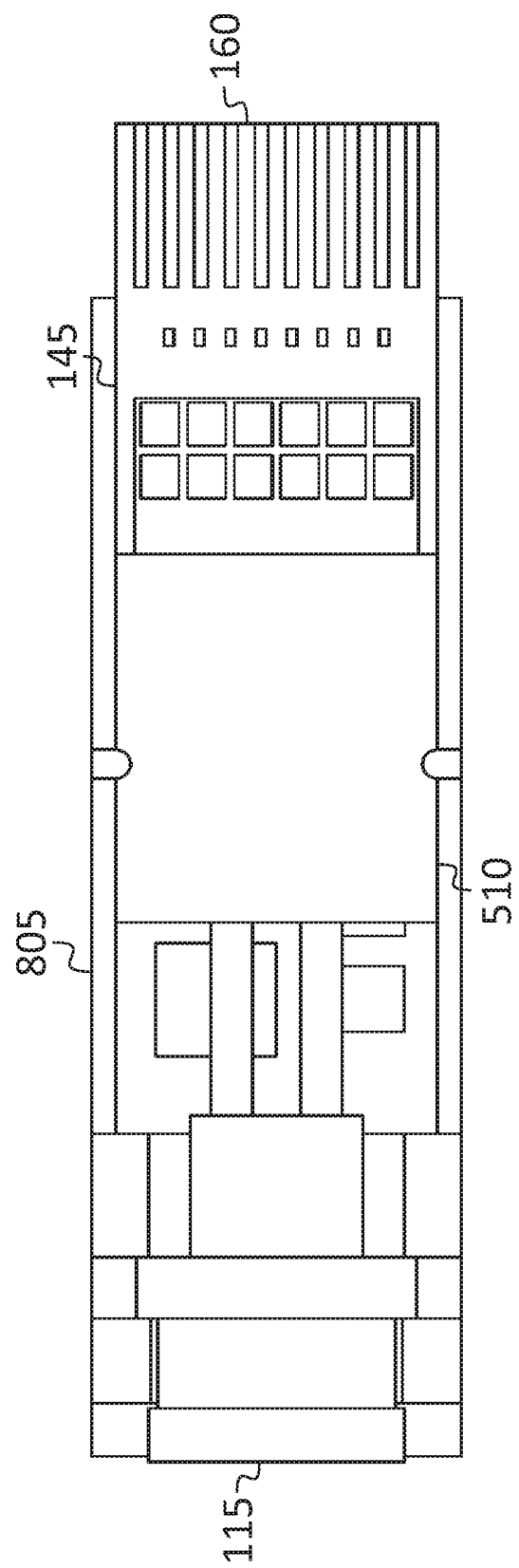
FIG. 8B is a top view of a portion of an optoelectronic module, according to an embodiment of the present disclosure.
Figure 9A:
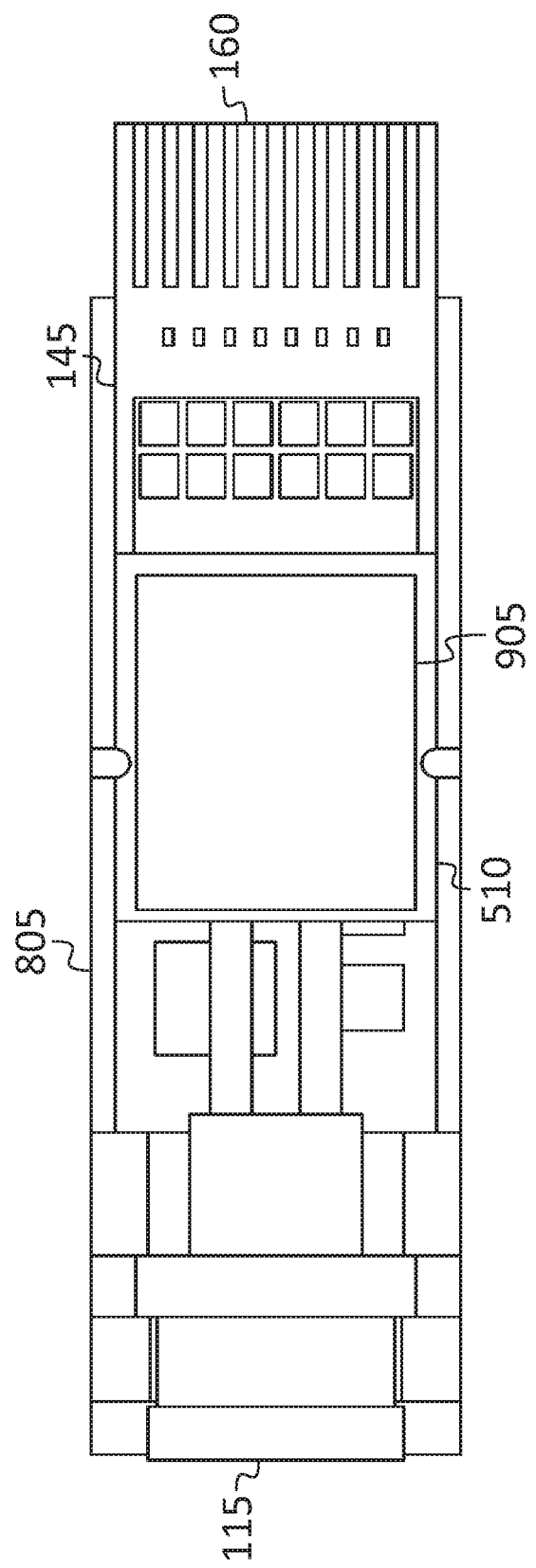
FIG. 9A is a top view of a portion of an optoelectronic module, according to an embodiment of the present disclosure.
Figure 9B:
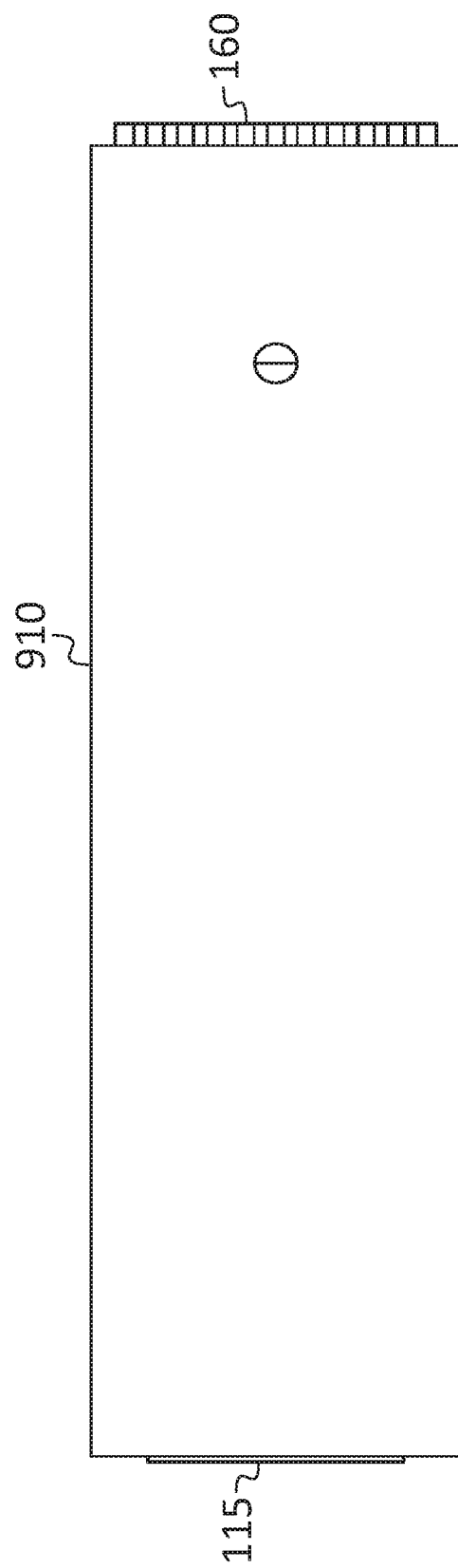
FIG. 9B is a top view of an optoelectronic module, according to an embodiment of the present disclosure.
Figure 10A:
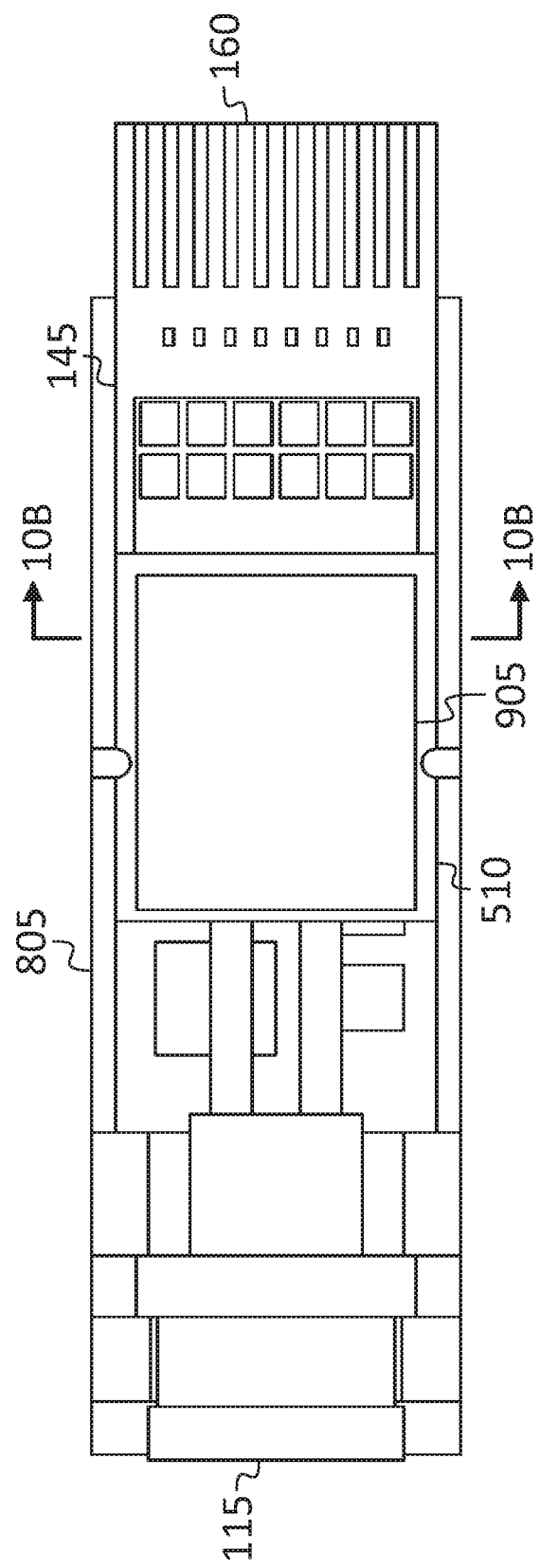
FIG. 10A is a top view of a portion of an optoelectronic module, according to an embodiment of the present disclosure.
Figure 10B:
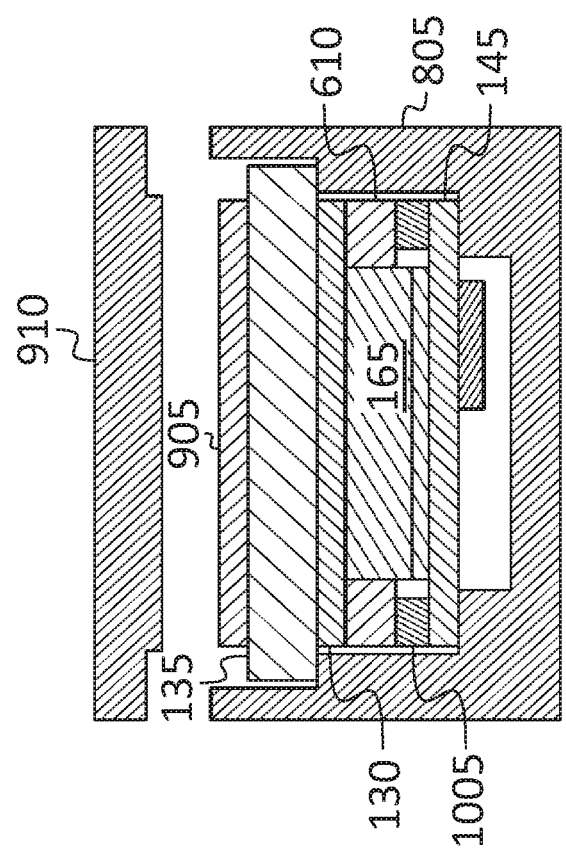
FIG. 10B is a cross-sectional view, along section line 10B-10B of FIG. 10A, of a portion of an optoelectronic module, according to an embodiment of the present disclosure.

The resulting subassembly may then be installed in a QSFP package housing. FIG. 8A shows the cast housing 805 with registration features 810 for engaging the semicircular cutouts 710 of the TROSA 510 and of the host board 145. FIG. 8B shows the TROSA 510 and the host board 145 installed in the housing 805. A thermal pad 905 may be placed on the subcarrier (FIG. 9A) and a lid may be installed on the QSFP package housing, to complete the assembly (FIG. 9B). FIG. 10A shows a top view of the assembly with the lid removed and FIG. 10B shows a cross-sectional view, along section line 10B-10B of FIG. 10A, of the assembly.

Figure 11A:
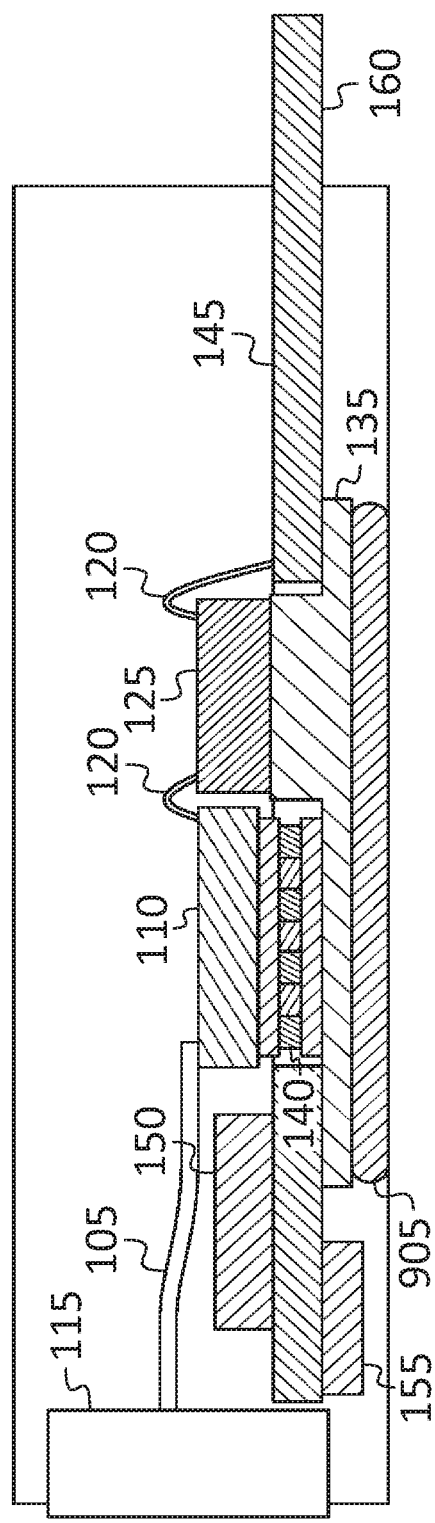
FIG. 11A is a schematic cross-sectional view of an optoelectronic module, according to an embodiment of the present disclosure.
Figure 11B:
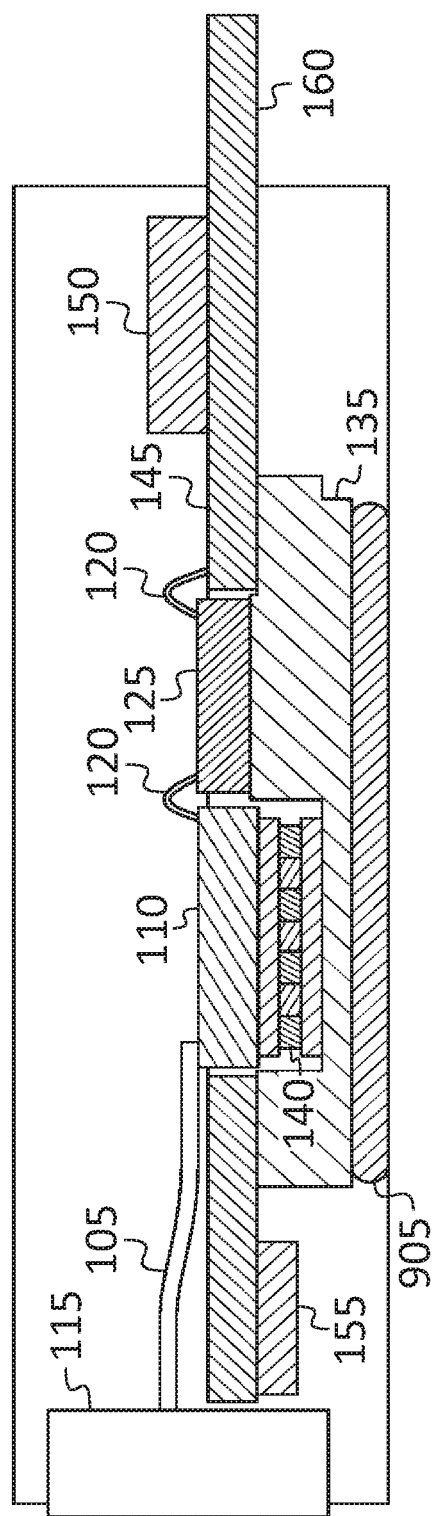
FIG. 11B is a schematic cross-sectional view of an optoelectronic module, according to an embodiment of the present disclosure.
Figure 11C:
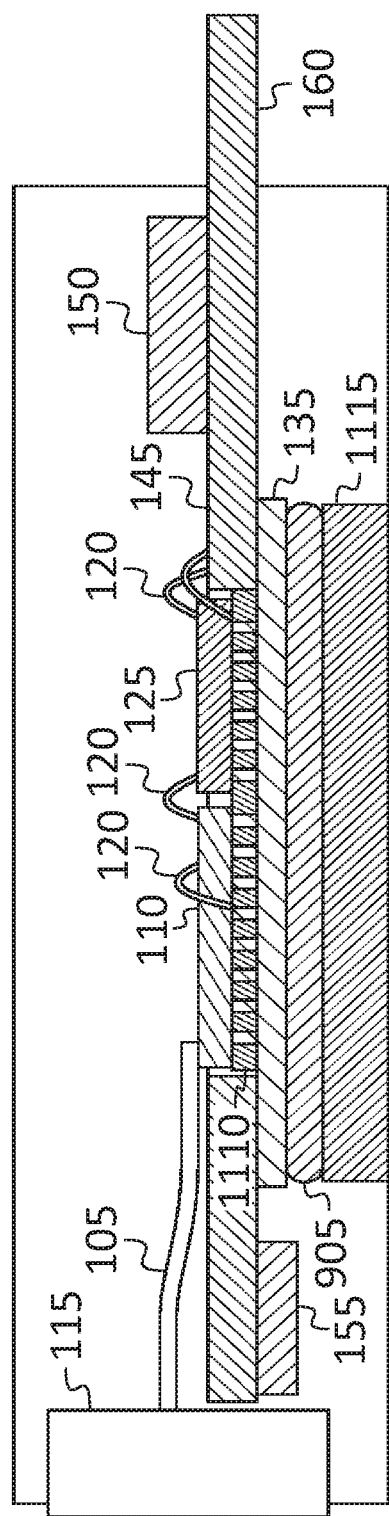
FIG. 11C is a schematic cross-sectional view of an optoelectronic module, according to an embodiment of the present disclosure.

FIGS. 11A-11C show embodiments in which the PIC 110 and the aASIC 125 are secured, directly or indirectly, to a subcarrier to form a testable TROSA including the fiber 105, the MPO connector 115, the PIC 110, the aASIC 125, the TEC 140 (if present), and the subcarrier 135. After testing, the TROSA is installed into a cutout in the host board 145 and the aASIC 125 is wire bonded to the host board 145. In FIGS. 11A-11C, the module is shown in an orientation in which the wall of the module to which a heat sink is directly connected, in operation, is the lower wall. In the embodiment of FIG. 11C, a printed circuit board with thermal vias 1110 supports the PIC 110 and the aASIC 125 and is in turn supported by the subcarrier 135. Wire bonds from the PIC 110 to the printed circuit board with thermal vias 1110 and from the host board 145 to the printed circuit board with thermal vias 1110 provide (along with traces on the printed circuit board with thermal vias 1110) low speed connections such as power and control connections. In the embodiments of FIGS. 11A and 11B, testing may be accomplished by probing pads on the aASIC 125. In the embodiment of FIG. 11C, pads on the printed circuit board with thermal vias 1110 may instead be probed; this may facilitate testing, as the pads on the substrate may be larger and may have a coarser pitch than pads on the aASIC aASIC in the embodiments of FIGS. 11A and 11B. In the embodiment of FIG. 11C, a pedestal 1115 (e.g., a cast pedestal that is an integral part of the module housing) supports the thermal pad 905 which supports the subcarrier 135.

Figure 12A:
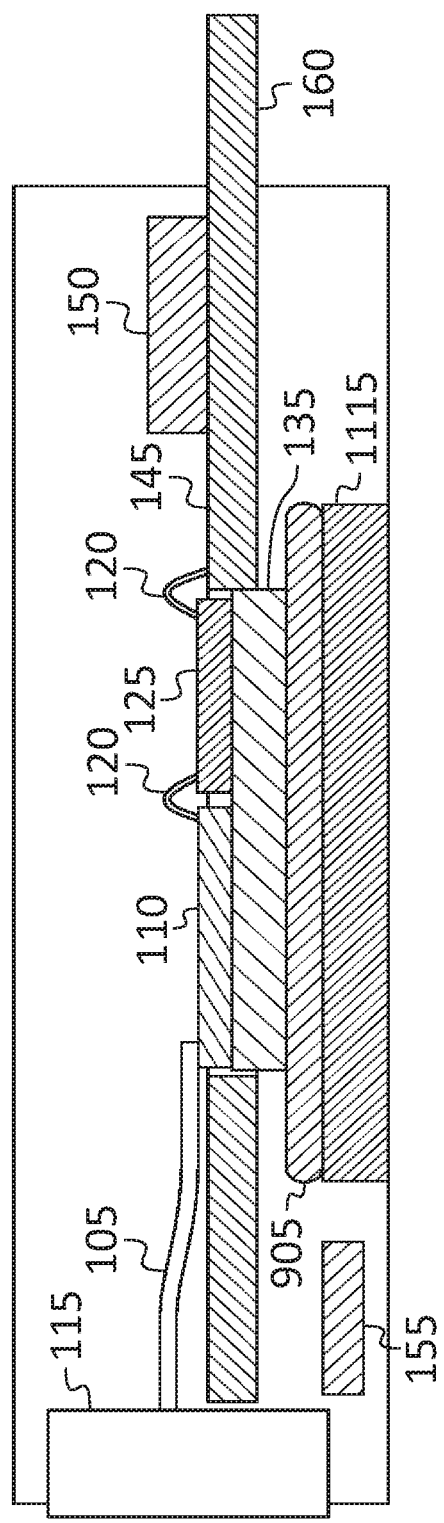
FIG. 12A is a schematic cross-sectional view of an optoelectronic module, according to an embodiment of the present disclosure.
Figure 12B:
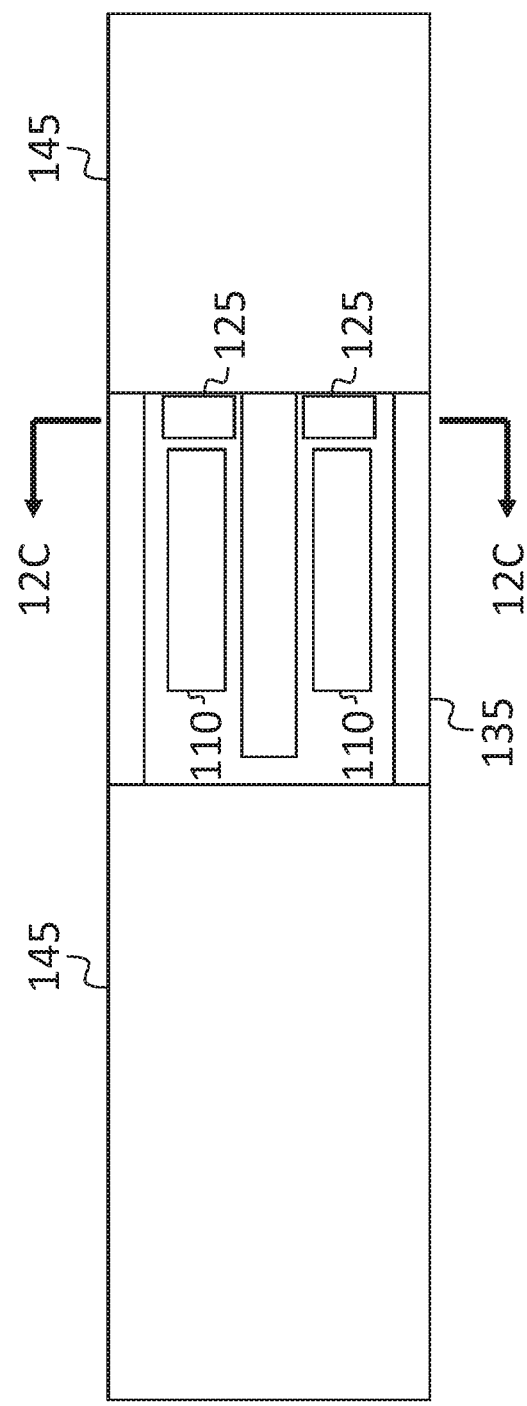
FIG. 12B is a schematic top view of a portion of an optoelectronic module, according to an embodiment of the present disclosure.
Figure 12C:
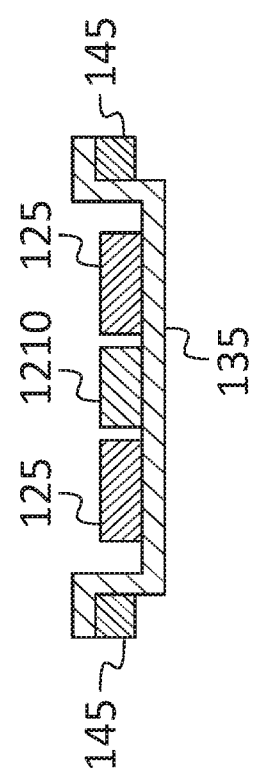
FIG. 12C is a cross-sectional view, along section line 12C-12C of FIG. 12B, of an optoelectronic module, according to an embodiment of the present disclosure.

FIGS. 12A-12C show another embodiment of a transceiver module. In this embodiment a coined, "top-drop" subcarrier 135 (which may be a copper subcarrier) supports the PICs 110 and the aASICs 125 as shown. After the TROSA is tested, the subcarrier 135 is installed in (e.g., "dropped into") a cutout (e.g., a rectangular cutout) in the host board 145 and the aASIC 125 is connected to the host board 145 by wire bonds. An electrical routing board 1210 is connected to the host board 145, to the PICs 110 and to the aASICs 125 by wire bonds, and provides low speed connections to the PICs 110 and to the aASICs 125.

Although exemplary embodiments of a module with transmit optical subassembly and receive optical subassembly have been specifically described and illustrated herein, many modifications and variations will be apparent to those skilled in the art. Accordingly, it is to be understood that a module with transmit optical subassembly and receive optical subassembly constructed according to principles of this disclosure may be embodied other than as specifically described herein. The invention is also defined in the following claims, and equivalents thereof.

What is claimed is:
1. A transceiver assembly, comprising:
a housing;
an optical subassembly; and
a host board comprising a printed circuit board,
the optical subassembly comprising:
    a fiber,
    a photonic integrated circuit,
    an analog electronic integrated circuit, and
    a single, monolithic, substantially planar subcarrier; and
    a thermoelectric cooler;
the subcarrier having a thermal conductivity greater than 10 W/m/K;
the photonic integrated circuit and the analog electronic integrated circuit being on the subcarrier;

the thermoelectric cooler being between the subcarrier and only the photonic integrated circuit among the photonic integrated circuit and the analog electronic integrated circuit;

the fiber being coupled to the photonic integrated circuit;

the subcarrier being parallel to, secured to, and in thermal contact with, a first wall of the housing;

the photonic integrated circuit being connected to the analog electronic integrated circuit; and the optical subassembly having a plurality of contact pads for establishing electrical connections between the analog electronic integrated circuit and test equipment probes, the optical subassembly being configured to be separately testable by supplying power to the optical subassembly through one or more of the contact pads and sending data to and/or receiving data from the optical subassembly through one or more of the contact pads.

2. The transceiver assembly of claim 1, wherein the analog electronic integrated circuit is adjacent to the photonic integrated circuit and connected to the photonic integrated circuit by a first plurality of wire bonds.

3. The transceiver assembly of claim 2, wherein the wire bonds extend from wire bond pads along an edge of the analog electronic integrated circuit to wire bond pads along an edge, of the photonic integrated circuit, nearest the analog electronic integrated circuit.

4. The transceiver assembly of claim 3, further comprising a flexible printed circuit, connected to the analog electronic integrated circuit.

5. The transceiver assembly of claim 4, wherein:
the optical subassembly further comprises a routing board, and
the analog electronic integrated circuit is connected to the flexible printed circuit through the routing board.

6. The transceiver assembly of claim 5, wherein:
the routing board is a printed circuit comprising an organic insulating material and conductive traces,
the routing board is connected to the analog electronic integrated circuit, along an edge of the analog electronic integrated circuit, by wire bonds.

7. The transceiver assembly of claim 6, wherein the flexible printed circuit is further connected to the host board.

8. The transceiver assembly of claim 1, wherein a thickness of a region of the subcarrier on which the analog electronic integrated circuit is located is greater than a thickness of a region of the subcarrier on which the photonic integrated circuit and the thermoelectric cooler are located.

9. A module, comprising:
a housing;
a substantially planar subcarrier;
a photonic integrated circuit; and
an analog electronic integrated circuit,
the subcarrier having a thermal conductivity greater than 10 W/m/K,
the photonic integrated circuit and the analog electronic integrated circuit being secured to a first side of the subcarrier,
the subcarrier being secured to a first wall of the housing, wherein a second side of the subcarrier, opposite the first side of the subcarrier, is parallel to, secured to, and in thermal contact with, an interior side of the first wall of the housing.

10. The module of claim 9, wherein the photonic integrated circuit is adjacent to the analog electronic integrated circuit.

11. The module of claim 10, wherein:
the photonic integrated circuit is connected to the analog electronic integrated circuit by wire bonds, and
the wire bonds extend from wire bond pads along an edge of the analog electronic integrated circuit to wire bond pads along an edge, of the photonic integrated circuit, nearest the analog electronic integrated circuit.

12. The module of claim 11, further comprising an optical subassembly comprising:
the subcarrier;
the photonic integrated circuit; and
the analog electronic integrated circuit,
the optical subassembly having a plurality of contact pads for establishing electrical connections between the analog electronic integrated circuit and test equipment probes, the optical subassembly being configured to be separately testable by supplying power to the optical subassembly through one or more of the contact pads and sending data to and and/or receiving data from the optical subassembly through one or more of the contact pads.

13. The module of claim 12, wherein the optical subassembly further comprises a flexible printed circuit, connected to the analog electronic integrated circuit.

14. The module of claim 13, wherein:
the optical subassembly further comprises a routing board connected to the analog electronic integrated circuit, along an edge of the analog electronic integrated circuit, by wire bonds;
the analog electronic integrated circuit is connected to the flexible printed circuit through the routing board; and
the routing board is a printed circuit comprising an organic insulating material and conductive traces.

15. The module of claim 14, wherein the flexible printed circuit is connected to the routing board by solder.

16. The module of claim 15, further comprising a host board comprising a microcontroller and/or a DC-DC converter, the host board being connected to the routing board through the flexible printed circuit.

17. A method for manufacturing a module, the method comprising:
assembling an optical subassembly comprising:
a fiber,
a photonic integrated circuit,
an analog electronic integrated circuit,
a single, monolithic substantially planar subcarrier, and
a thermoelectric cooler,
the photonic integrated circuit and the analog electronic integrated circuit being on the subcarrier,
the thermoelectric cooler being between the subcarrier and only the photonic integrated circuit among the photonic integrated circuit and the analog electronic integrated circuit;
testing the optical subassembly;
determining that the testing of the optical subassembly was successful; and
in response to determining that the testing of the optical subassembly was successful:
installing, in a housing:
the optical subassembly, and
a host board comprising a printed circuit board, with:
the subcarrier being parallel to, secured to, and in thermal contact with, a first wall of the housing.

18. The method of claim 17, wherein:
the optical subassembly has a plurality of contact pads for establishing electrical connections between the analog electronic integrated circuit and test equipment probes; and
the testing of the optical subassembly comprises:
   transmitting modulated light into the photonic integrated circuit through the fiber, and
   verifying the presence, at the contact pads, of electrical signals corresponding to the modulation of the modulated light; or
the testing of the optical subassembly comprises:
   applying electrical signals to the contact pads, and
   verifying the presence, in light transmitted through the fiber from the photonic integrated circuit, of modulation corresponding to the electrical signals.

19. The method of claim 18, further comprising:
in response to determining that the testing of the optical subassembly was successful, connecting the host board to the optical subassembly, wherein the host board comprises a microcontroller and/or a DC-DC converter.

20. The method of claim 19, wherein the connecting of the host board to the optical subassembly comprises soldering the host board to the optical subassembly.

* * * * *